(12) United States Patent
Dehe et al.

(10) Patent No.: US 11,679,461 B2
(45) Date of Patent: Jun. 20, 2023

(54) SUPPORT STRUCTURE AND METHOD OF FORMING A SUPPORT STRUCTURE

(71) Applicant: Infineon Technologies AG, Neubiberg (DE)

(72) Inventors: Alfons Dehe, Villingen Schwenningen (DE); Reinhard Gabl, Kufstein (AT); Ulrich Krumbein, Rosenheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/681,848

(22) Filed: Feb. 28, 2022

(65) Prior Publication Data

US 2022/0388105 A1 Dec. 8, 2022

Related U.S. Application Data

(62) Division of application No. 16/402,248, filed on May 3, 2019, now Pat. No. 11,292,097.

(51) Int. Cl.
| | |
|---|---|
| *B23Q 3/18* | (2006.01) |
| *H04R 7/18* | (2006.01) |
| *H04R 17/00* | (2006.01) |
| *H04R 19/00* | (2006.01) |
| *H04R 31/00* | (2006.01) |

(Continued)

(52) U.S. Cl.
CPC .............. *B23Q 3/18* (2013.01); *B81B 3/0072* (2013.01); *B81C 1/00158* (2013.01); *H04R 7/18* (2013.01); *H04R 17/00* (2013.01); *H04R 19/005* (2013.01); *H04R 31/003* (2013.01); *B81B 2201/0257* (2013.01); *B81B 2201/0264* (2013.01); *B81B 2203/0127* (2013.01);

(Continued)

(58) Field of Classification Search
CPC . B23Q 3/18; B81B 3/0072; B81B 2201/0257; B81B 2201/0264; B81B 2203/0127; B81B 3/007; B81C 1/00158; H04R 7/18; H04R 17/00; H04R 19/005; H04R 31/03; H04R 2201/003; H04R 2307/207; H04R 2499/11; H01L 2924/1461; G01L 9/0042; G01L 9/0048
USPC ...................................... 428/415, 411.1, 41.5
See application file for complete search history.

(56) References Cited

U.S. PATENT DOCUMENTS 5,589,703 A * 12/1996 Baskett ................. G01L 9/0083
257/419
5,949,118 A * 9/1999 Sakai .................... G01L 9/0042
257/419

(Continued)

*Primary Examiner* — Christopher Garft
*Assistant Examiner* — Michael McDuffie
(74) *Attorney, Agent, or Firm* — Viering, Jentschura & Partner mbB

(57) ABSTRACT

A structure for fixing a membrane to a carrier including a carrier; a suspended structure; and a holding structure with a rounded concave shape which is configured to fix the suspended structure to the carrier and where a tapered side of the holding structure physically connects to the suspended structure is disclosed. A method of forming the holding structure on a carrier to support a suspended structure is further disclosed. The method may include: forming a holding structure on a carrier; forming a suspended structure on the holding structure; shaping the holding structure such that it has a concave shape; and arranging the holding structure such that a tapered side of the holding structure physically connects to the suspended structure.

19 Claims, 8 Drawing Sheets

(51) Int. Cl.
  *B81B 3/00* (2006.01)
  *B81C 1/00* (2006.01)
(52) U.S. Cl.
  CPC .............. *H01L 2924/1461* (2013.01); *H04R 2201/003* (2013.01); *H04R 2307/207* (2013.01); *H04R 2499/11* (2013.01)

(56) References Cited

U.S. PATENT DOCUMENTS

| | | | | |
|---|---|---|---|---|
| 6,619,133 | B1* | 9/2003 | Goshoo | G01L 9/0055 257/419 |
| 6,847,090 | B2* | 1/2005 | Loeppert | H04R 19/04 438/53 |
| 7,786,541 | B2* | 8/2010 | Izuo | G01L 9/0054 257/419 |
| 8,044,472 | B2* | 10/2011 | Kurtz | B82Y 30/00 257/77 |
| 8,188,556 | B2* | 5/2012 | Adachi | G01L 9/0054 257/419 |
| 2006/0050905 | A1* | 3/2006 | Ohbayashi | H04R 19/005 381/175 |
| 2007/0196946 | A1* | 8/2007 | Kasai | C23C 16/56 257/E29.324 |
| 2008/0029852 | A1* | 2/2008 | Murayama | B81C 1/0023 438/455 |
| 2008/0054486 | A1* | 3/2008 | Murayama | B81C 1/00103 257/E21.585 |
| 2009/0098343 | A1* | 4/2009 | Arena | H01L 21/0254 257/E21.04 |
| 2010/0133630 | A1* | 6/2010 | Scheuerer | H01L 21/76898 257/E21.211 |
| 2010/0207218 | A1* | 8/2010 | Taguchi | H01L 24/05 29/832 |
| 2010/0224872 | A1* | 9/2010 | Kimura | H01L 27/1225 257/E33.013 |
| 2010/0264274 | A1* | 10/2010 | Bradley | B32B 7/12 156/60 |
| 2011/0169109 | A1* | 7/2011 | Langereis | G01P 15/0802 257/E21.211 |
| 2014/0042608 | A1* | 2/2014 | Kim | H01L 23/04 257/686 |
| 2015/0210535 | A1* | 7/2015 | Roth | G01L 9/00 257/419 |
| 2015/0253208 | A1* | 9/2015 | Dehe | G01L 1/14 73/777 |
| 2016/0056333 | A1* | 2/2016 | Takeuchi | H01S 5/18361 257/76 |
| 2017/0005035 | A1* | 1/2017 | Chen | H01L 24/19 |
| 2017/0174506 | A1* | 6/2017 | Gianchandani | B81B 7/02 |
| 2018/0047868 | A1* | 2/2018 | David | H01L 33/025 |

\* cited by examiner

FIG. 5

```
                    500
                     │
                    502
  ┌─────────────────────────────────────────┐
  │ Forming a holding structure on a carrier │
  └─────────────────────────────────────────┘
                     │
                    504
  ┌─────────────────────────────────────────┐
  │ Forming a suspended structure on the    │
  │ holding structure                        │
  └─────────────────────────────────────────┘
                     │
                    506
  ┌─────────────────────────────────────────┐
  │ Shaping the holding structure such that │
  │ it has a concave shape                   │
  └─────────────────────────────────────────┘
                     │
                    508
  ┌─────────────────────────────────────────┐
  │ Arranging the holding structure such    │
  │ that a tapered side of the holding       │
  │ structure physically connects to the     │
  │ suspended structure                      │
  └─────────────────────────────────────────┘
```

SUPPORT STRUCTURE AND METHOD OF FORMING A SUPPORT STRUCTURE

RELATED APPLICATION(S)

This application is a divisional of U.S. patent application Ser. No. 16/402,248, filed May 3, 2019, entitled "SUPPORT STRUCTURE AND METHOD OF FORMING A SUPPORT STRUCTURE", which is a divisional of U.S. patent application Ser. No. 14/198,646, filed Mar. 6, 2014, entitled "SUPPORT STRUCTURE AND METHOD OF FORMING A SUPPORT STRUCTURE", the contents of above listed applications are incorporated herein by reference in their entirety.

TECHNICAL FIELD

Various embodiments relate to a graded structure for fixing a membrane to a carrier and to a method for manufacturing the graded structure.

BACKGROUND

The ability to produce thin membranes that are able to withstand repeated cycles of high physical displacement is essential to the production and further miniaturization of a variety of micro-electro-mechanical system (MEMS) transducers. These MEMS transducer systems are integrated into a wide array of portable electronic devices. In most of the portable electronic devices that use these MEMS transducer systems, miniaturization is essential to commercial success. Many of these systems, particularly transducers based on the detection and/or generation of membrane deflection due to a received signal or an electrical input, require that a very thin membrane be suspended between several support structures in order to operate.

SUMMARY

In accordance with various embodiments, a structure for fixing a membrane to a carrier is disclosed. The structure may include: a carrier; a suspended structure; and a holding structure configured to fix the suspended structure to the carrier. The holding structure may have a rounded, concave shape and a tapered side of the holding structure may physically connect to the suspended structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a flow diagram illustrating a method of forming a structure in accordance with various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments relate generally to a structure for fixing a membrane on a carrier while reducing the stress imposed on the membrane at the fixing points and a method for forming the fixing structure.

Figure 1A:
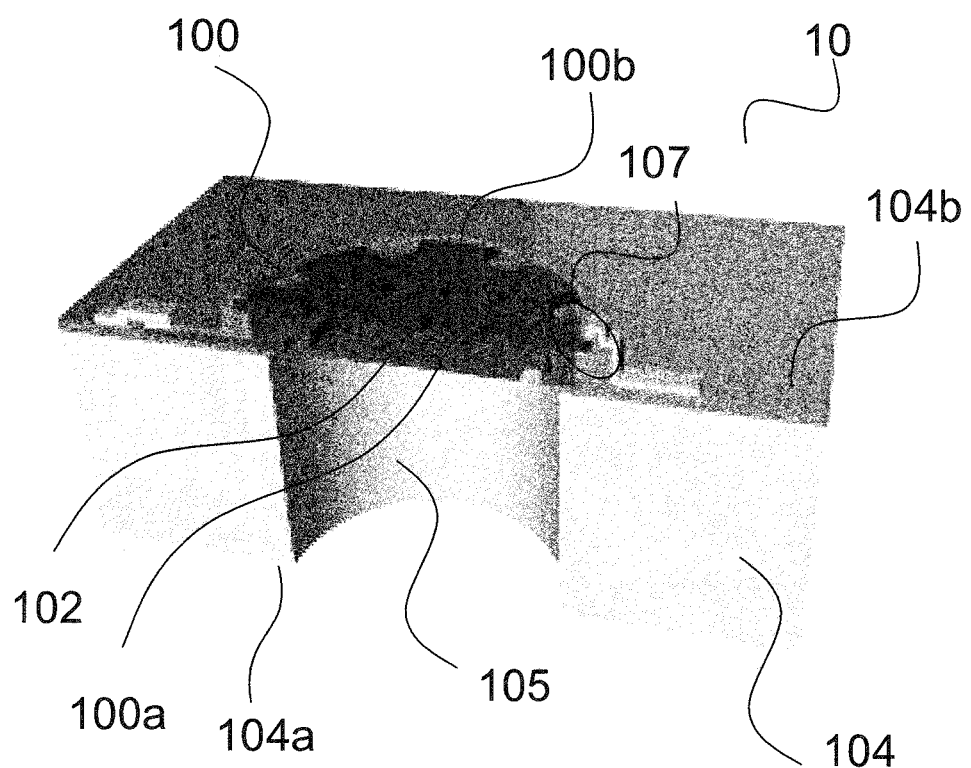
FIG. 1A shows a cross sectional view of a MEMS microphone.

FIG. 1A is a schematic representation of a perspective cross sectional view of a MEMS microphone 10. In the MEMS microphone 10, the active areas may include a very thin membrane 100, e.g. having a thickness of a few hundred nanometers, as well as a counter electrode 102 suspended over a cavity 105 formed in substrate 104.

In the MEMS microphone 10, the substrate 104 may be a semiconductor substrate, e.g. a substrate includes or essentially consists of silicon, germanium, silicon germanium, gallium nitride, gallium arsenide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as are appropriate for a given application.

In various embodiments of the MEMS microphone 10, the membrane 100 may be a semiconductor membrane, e.g. a silicon, poly-silicon, and/or a silicon nitride membrane. The membrane 100 may include or essentially consist of various other semiconductor materials as necessary for a given application. Further, the membrane 100 may be at least partially metalized.

In various embodiments of the MEMS microphone 10, the counter electrode 102 may at least partially include or essentially consist of a semiconductor material, e.g. silicon, that may be at least partially metalized. In some embodiments, the counter electrode 102 may be metal or may include a metal layer, e.g. copper or a copper layer.

The MEMS microphone 10 with the membrane 100 may be etched from a backside 104a of the substrate 104, wherein the backside 104a may be opposite the side (which may be referred to as a frontside 104b of the substrate 104) on which the counter electrode 102 is provided. The counter electrode 102 may be very thin, e.g. having a thickness in the range from about 100 nm to about 1 μm, e.g. in the range from about 100 nm to about 250 nm, e.g. in the range from about 250 nm to about 500 nm, e.g. in the range from about 500 nm to 1 about μm. Acoustic waves impinging on the membrane 100 may cause the membrane 100 to oscillate. The acoustic waves may be detected by measuring the capacitance change due to the oscillation of the membrane 100. In other words, as the distance between membrane 100 and counter electrode 102 may vary, the capacitance generated may also vary. The performance of the MEMS microphone 10 may depend on a volume and a shape of a cavity 105 formed from the backside 104a of the substrate 104 exposing a backside 100a of the membrane 100, i.e. the side opposite a frontside 100b of the membrane 100, which acoustic wave impinge on. One barrier to the miniaturization of the MEMS microphone 10 may be a stress imposed on the membrane 100 during oscillation, e.g. at fixing points, at which the membrane 100 is mounted (in other words fixed) to the substrate 104. This may lead to a membrane fracture and a premature failure of the MEMS microphone 10. The stress may be of particular concern at the fixing points 107, where the membrane 100 is fixed to the substrate 104.

Figure 1B:
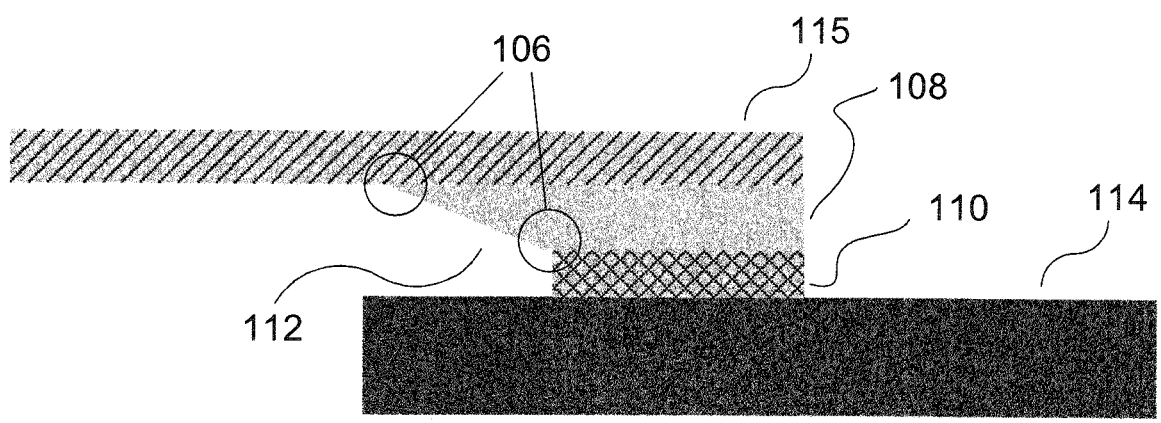
FIG. 1B shows a close-up, cross-sectional view of a currently available strategy for dealing with stresses imposed on a membrane by the fixing means used to attach a membrane to a carrier. The current solution includes using at least two materials with different etching rates such that, when the materials are etched, a long tapered structure is produced which thereby reduces the stress on the membrane

Currently available strategies and devices for reducing the stress at the fixing points 107 involve, as illustrated in FIG. 1B, a tapered support structure which includes or essentially consists of two or more materials e.g. 108 and 110, with different etch rates such that when the materials are etched, the taper is formed.

A first membrane support material 110, may have a thickness ranging from 100 nm to 800 nm, e.g. from 100 nm to 250 nm, e.g. from 250 nm to 500 nm, e.g. from 500 nm to 800 nm. A second membrane support material 108 may have a thickness ranging from 150 nm to 300 nm. The first membrane support material 110 may be silicon oxide $SiO_2$. The second membrane support material 108 may be silicon oxynitride (SiON). The result may be the creation of a two-layer structure including oxide ($SiO_2$) and oxynitride. If various isotropic wet-etching techniques are used, etching rate of $SiO_2$ will be higher than that of SiON. One possible result of this process is a triangular overhang 112 of SiON, as shown in FIG. 1B.

In the configuration shown in FIG. 1B, the membrane 115 usually has a thickness ranging from 250 nm to 400 nm.

The tapered support structure consisting of membrane support structures 108 and 110, mitigates the initial stress on the membrane 115 at the fixing points 107 by distributing the stress into two lower stress zones 106. However, the abrupt transitions and/or corners or edges in the lower stress zones 106 still present areas where stress may be imposed on the membrane 115.

The current disclosure may provide an improved clamping and/or support structure for attaching thin membranes to a substrate or carrier. The current disclosure may also provide for a method of producing the improved clamping device. The clamping structure of the present disclosure may eliminate the abrupt transitions or edges, present in currently available solutions, e.g. by implementing a support structure that has a gradually curved, concave, tapered shape instead of the sharp, angular tapered shapes available with current technology and/or techniques. Structures and methods provided in accordance with various embodiments may reduce or eliminate at least some of the disadvantages present in current membrane clamping techniques.

In accordance with various embodiments, a structure for clamping or fixing a membrane to a carrier in a MEMS transducer or transducer system is disclosed.

Figure 2:
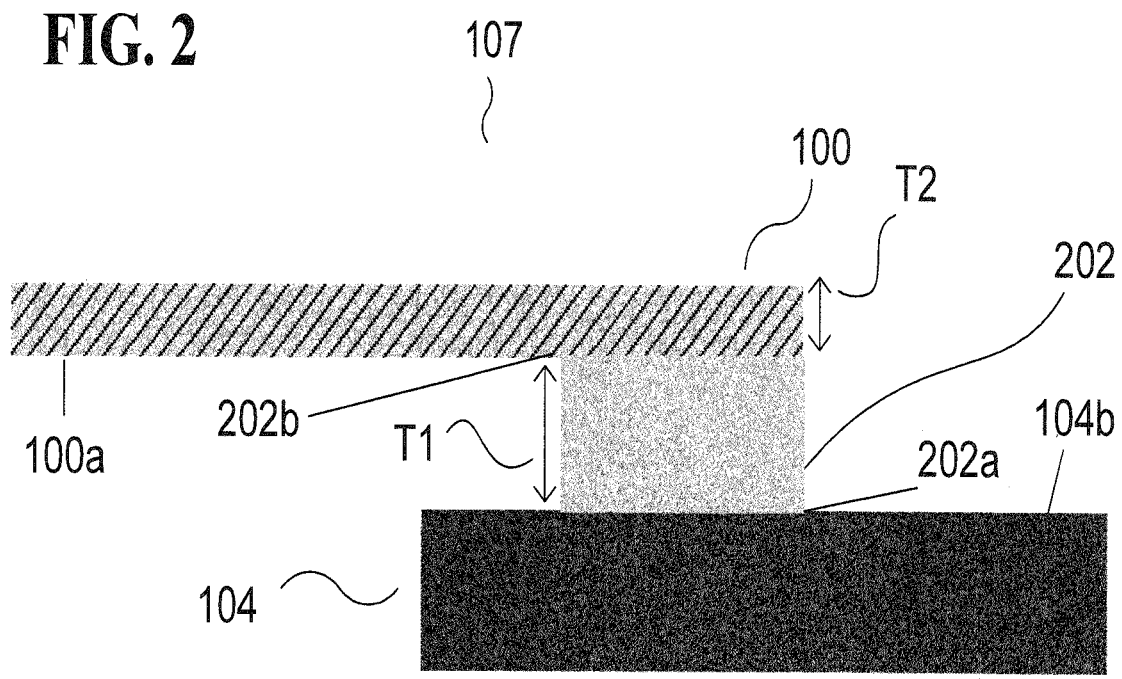
FIG. 2 shows a structure in accordance with various embodiments.

According to various embodiments, the structure for clamping or fixing the membrane 100 to the substrate 104 (in other words carrier) may be a holding structure 202, formed on a carrier 104, as illustrated in FIG. 2.

Figure 3:
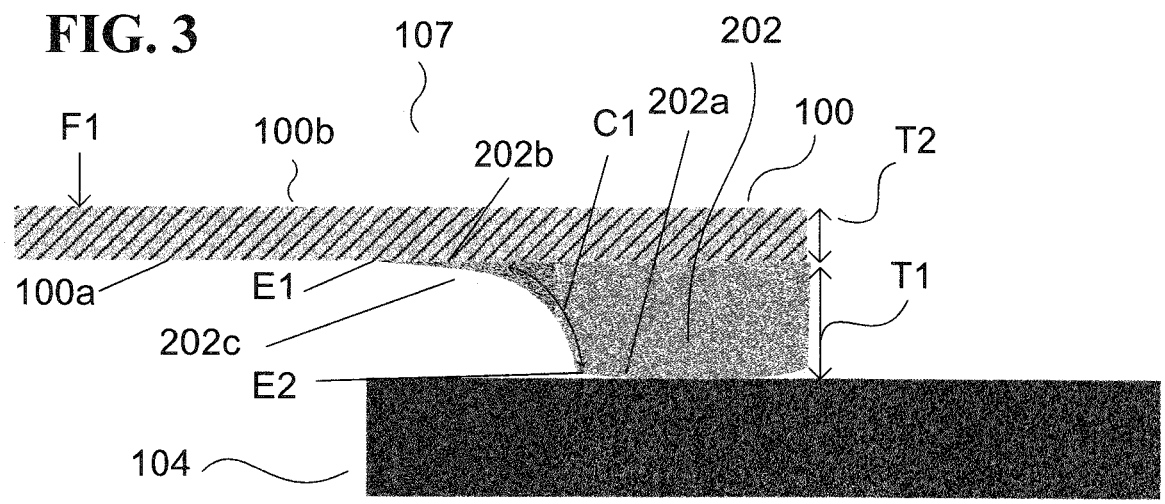
FIG. 3 shows a structure in accordance with various embodiments.

According to various embodiments, at least one side of the holding structure 202 may have a tapered, concave shape, as illustrated in FIG. 3. If the membrane 100 deflects or deforms due to a given force, e.g. a sound wave, the tapered, concave shape of the holding structure 202 may mitigate any stress that may be imposed on the membrane 100 by the holding structure 202 during a membrane deflection. For example, if the tapered structure was implemented in a MEMS microphone, when the membrane 100 oscillates and deforms in a direction F1, due to an incident sound wave, any stress imposed on the membrane 100 by the holding structure 202 may be distributed across the curved surface C1, instead of being concentrated in a few high-stress zones as with currently available solutions.

The holding structure 202 may be deposited on the carrier 104 by means of various fabrication techniques, e.g. physical vapor deposition, electrochemical deposition, chemical vapor deposition, molecular beam epitaxy, and atomic layer deposition. According to various embodiments, the carrier 104 may include or may include or essentially consist of material appropriate for a given application, for example a semiconductor material such as including or essentially consisting of germanium, silicon germanium, silicon carbide, gallium nitride, gallium arsenide, indium, indium gallium nitride, indium gallium arsenide, indium gallium zinc oxide, or other elemental and/or compound semiconductors. The carrier 104 may also include other materials or combinations of material, for example various dielectrics, metals and polymers as are appropriate for a given application. The carrier 104 may further include or may include or essentially consist of, for example, glass, and/or various polymers. According to at least one embodiment, the carrier 104 may be a silicon-on-insulator (SOI) carrier.

According to various embodiments, a thickness T1 of holding structure 202 may be, e.g. in the range from about 100 nm to 1 μm, e.g. from about 100 nm to 250 nm, e.g. from about 250 nm to 500 nm, e.g. from about 500 nm to 1 μm. According to at least one embodiment, the membrane 100 may be deposited onto the holding structure 202 after the holding structure 202 is deposited on the carrier 104. The suspended structure 100 may be deposited onto the holding structure 202 through various fabrication techniques, e.g. physical vapor deposition, electrochemical deposition, chemical vapor deposition, molecular beam epitaxy, and atomic layer deposition.

According to various embodiments, a thickness T2 of the membrane 100 may be, e.g. in the range from about 300 nm to 1 μm, e.g. from about 300 nm to 400 nm, e.g. from about 400 nm to 500 nm, e.g. from about 500 nm to 1 μm.

According to various embodiments, the membrane 100 may be a semiconductor membrane, e.g. a silicon membrane. The membrane 100 may include or essentially consist of various other semiconductor materials as necessary for a given application. For example, the membrane 100 may include or essentially consist of germanium, silicon germanium, silicon carbide, gallium nitride, gallium arsenide, indium, indium gallium nitride, indium gallium arsenide, indium gallium zinc oxide, or other elemental and/or compound semiconductors.

According to various embodiments, the membrane 100 may include or essentially consist of or may include at least one of a dielectric material, a piezoelectric material, a piezoresistive material, a ferroelectric material, and various metals.

According to various embodiments, the concave, tapered shape of holding structure 202 may be obtained through an etching process that does not etch the membrane 100. Such a continuously varying and/or graded etch process may be achieved by varying the material composition of holding structure 202 such that the etch rate at point E1 on holding structure 202 is lower than the etch rate at point E2. Various etching techniques may be used to obtain the tapered shape of holding structure 202, e.g. isotropic gas phase etching, vapor etching, wet etching, isotropic dry etching, plasma etching, etc. For example, the concave, tapered shape of holding structure 202 may be obtained through an etching process where the etching rate of the holding structure 202 is not constant throughout the material. This effect may be achieved, for example, by composing holding structure 202 of a silicon oxinitride compound and etching the holding structure 202 with a fluoridic acid while varying or grading the nitrogen content X in the silicon oxinitride such that the chemical composition of the silicon oxinitride may be defined by $SiO_{1-x}N_x$. According to various embodiments, a silicon oxinitride compound with a varying nitrogen content may be produced through the use of various fabrication techniques, e.g. physical vapor deposition, electrochemical deposition, chemical vapor deposition, molecular beam epitaxy, and atomic layer deposition. For example, by controlling and/or varying the nitrogen content of the material being deposited, the deposited silicon oxinitride material may have a nitrogen content that is continuously varied and/or graded throughout the material e.g. ranging from a low concentration of nitrogen at the point E2 to a higher concentration of nitrogen at the point E1. In various embodiments, the low concentration of nitrogen at the point E2 may be in the range from about 0% to about 100%, e.g. in the range from about 40% to about 80%. Furthermore, the higher concentration of nitrogen at the point E1 may be in the range from about 50% to about 100%, e.g. in the range from about 10% to about 50%.

The holding structure thus illustratively may include a first material and a second material different from the first material. The concentration of the second material in the first material may be continuously varied as a function of location within the first material relative to the carrier.

According to various embodiments, the point E1 of holding structure 202 may be arranged at a top surface 202b of the holding structure 202, in other words, according to various embodiments, the point E1 may be located in the portion of holding structure 202 which may be fixed to the backside 100a of the membrane 100. According to various embodiments, the point E1 of holding structure 202 may be arranged on a side of the holding structure 202 which may be overhung and/or enclosed by the membrane 100 and adjacent to the cavity 105, i.e. a side and/or face of the holding structure 202 which may be nearest to the cavity 105.

According to various embodiments, the point E2 in holding structure 202 may be arranged at a bottom surface 202a of the holding structure 202, in other words, according to various embodiments, the point E2 may be located in the portion of holding structure 202 which is fixed to the frontside 104b of the substrate 104. According to various embodiments, the point E2 of holding structure 202 may be arranged on a side of holding structure 202 which may be overhung and/or enclosed by the membrane 100 and adjacent to the cavity 105, i.e. a side and/or face of the holding structure 202 which may be nearest to the cavity 105.

According to various embodiments, many different semiconductor materials may be used in conjunction with the variable etch rate as described above. For example, the tapered shape described above may be obtained by composing the holding structure 202 of at least one of silicon germanium, gallium arsenide, silicon carbide, gallium nitride, gallium arsenide, indium, and other elemental and/or compound semiconductors and then etching the compound with various anisotropic wet etching agents such as various phosphoric acid solutions such as e.g. hydrofluoric acid, various oxide solutions, e.g. tetramethylammonium hydroxide, and ethylenediamine pyrocatechol. The semiconductor materials may likewise be etched through the use of various isotropic agents. According to various embodiments, plasma etching may also be used in the variable etch rate process as described above. According to various embodiments, the tapered shape described above may be obtained by composing the holding structure 202 of various other materials, e.g. a metallic material, various metal alloys and/or compound metals, and various elemental metals as may be desirable for a given application.

According to various embodiments, the tapered shape described above may be obtained by composing the holding structure 202 of several different materials, each with slightly differing etch rates and arranging the materials such that, when etched, the tapered shape described above may be formed. In other words, the holding structure 202 may be implemented as a type of composite and/or laminate structure of a plurality of different materials, where each material in the composite structure may have a slightly different etch rate from the other materials used to implement the composite structure. According to various embodiments, only one type of etchant and/or only a single etching step may be necessary to shape the holding structure 202 into the tapered shape described above. In various embodiments where the holding structure 202 may be implemented as a type of composite structure, the tapered shape described above may be achieved by arranging the various materials in the composite structure such that, when etched, the tapered shape is achieved. In various embodiments where the holding structure 202 may be implemented as a type of composite structure, the composite structure may be produced through the use of various fabrication techniques, e.g. physical vapor deposition, electrochemical deposition, chemical vapor deposition, molecular beam epitaxy, and atomic layer deposition.

According to various embodiments, as illustrated in FIG. 3, after the graded holding structure 202 has been formed, stress imposed on membrane 100 may be distributed or disbursed across the entire span of the curved section C1, instead of being concentrated in stress zones 106 as with various currently available technologies. The graded holding structure 202 may be implemented as a type of rounded arch or vaulted support structure.

Figure 4:
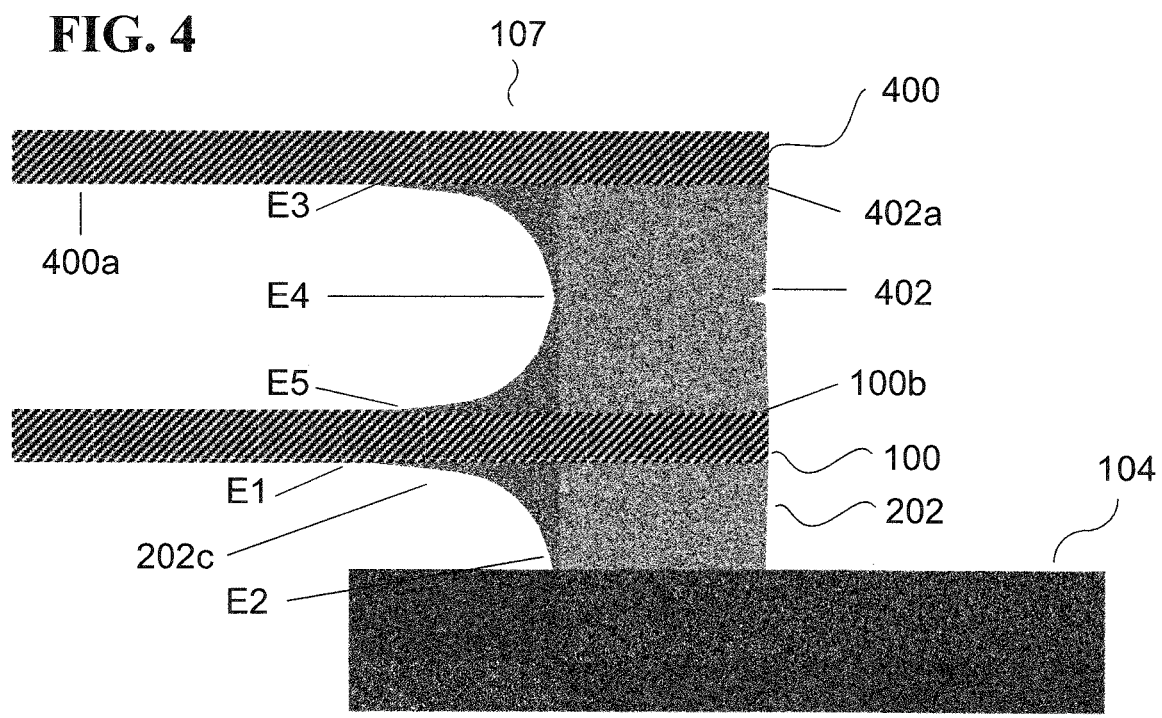
FIG. 4 shows an embodiment where multiple structures, as shown in FIG. 2, have been formed on top of one another to create a multi-membrane stack structure.

According to various embodiments, as illustrated in FIG. 4, a further graded holding structure 402 may be formed on the frontside 100b of membrane 100 and a further membrane 400 may be formed on a top side 402a of the further holding structure 402. The further holding structure 402 may be formed through a similar process used to form holding structure 202, as described above. For example, the material composition of the further holding structure 402 may be configured such that the etch rates at points E3 and E5, respectively, on holding structure 402 are lower than the etch rate at point E4.

According to various embodiments, the point E3 of the further holding structure 402 may be arranged at the top side 402*a* of the further holding structure 402, in other words, according to various embodiments, the point E3 may be located in a portion of the further holding structure 402 which may be fixed to a backside 400*a* of the further membrane 400. According to various embodiments, the point E3 of the further holding structure 402 may be arranged on a side of the further holding structure 402 which may be overhung by the further membrane 400 and may be between and/or may be bracketed by the frontside 100*b* of membrane 100 and the backside 400*a* of the further membrane 400, respectively.

According to various embodiments, the point E5 of the further holding structure 402 may be arranged at the frontside 100*b* of membrane 100, in other words, according to various embodiments, the point E5 may be located in a portion of the further holding structure 402 which may be fixed to the frontside 100*b* of membrane 100. According to various embodiments, the point E5 of the further holding structure 402 may be arranged on a side of the further holding structure 402 which may be overhung by the further membrane 400 and may be between and/or may be bracketed by the frontside 100*b* of membrane 100 and the backside 400*a* of the further membrane 400, respectively.

According to various embodiments, the point E4 of the further holding structure 402 may be arranged at a given point between points E3 and E5 on a surface of the further holding structure 402 which may be nearest to the cavity 105. For example, according to various embodiments the point E4 may be co-located with either point E3 or E5; according to various embodiments point E4 may be located equidistant between points E3 and E5; according to various embodiments point E4 may be located at any point between points E3 and E5 on the further holding structure 402 as may be desired for a given application. According to various embodiments, the point E4 may be located in a portion of the further holding structure 402 which may be arranged on a side of the further holding structure 402 which is overhung by the further membrane 400 and may be between and/or may be bracketed by the frontside 100*b* of membrane 100 and the backside 400*a* of the further membrane 400, respectively.

According to various embodiments, as illustrated in FIG. 4, the further graded holding structure 402 and the further membrane 400 may be implemented as a stack and/or stacked structure in conjunction with graded holding structure 202 and membrane 100. According to various embodiments, additional holding structures and membranes (not shown) may be added to this stack structure through the use of a method similar to that describe above. According to various embodiments the stack structure may contain as many additional holding structures and membranes as may be desired for a given application.

According to various embodiments, the curved section C1, as illustrated in FIG. 3, may defined as a circular or substantially circular shaped section. In various embodiments, curved section C1 may be an elliptical or substantially elliptical shaped section. In various embodiments, the curved section C1 may be parabolic or substantially parabolic in shape. In various embodiments, the curved section C1 may be hyperbolic or substantially hyperbolic in shape. In various embodiments, the radius of curvature of section C1 may be adjusted as is desired to define the shape for a given application.

According to various embodiments, the holding structure 202 may be implemented in a MEMS structure, e.g. in a anchored MEMS structure.

According to various embodiments, the holding structure 202 may be implemented in a MEMS microphone or microphone system.

According to various embodiments, as illustrated in FIG. 5, a method 500 of forming a holding structure on a carrier to support a suspended structure is disclosed. The method 500 may include, as indicated in 502, forming a suspended structure over a carrier; forming a holding structure, as indicated in 504 to fix the suspended structure to the carrier; the method 500 may further include, as indicated in 506, shaping the holding structure such that it has a concave shape. The method 500 may further include, as indicated in 508, arranging the holding structure such that a tapered side of the holding structure may physically connect to the suspended structure.

Figure 6:
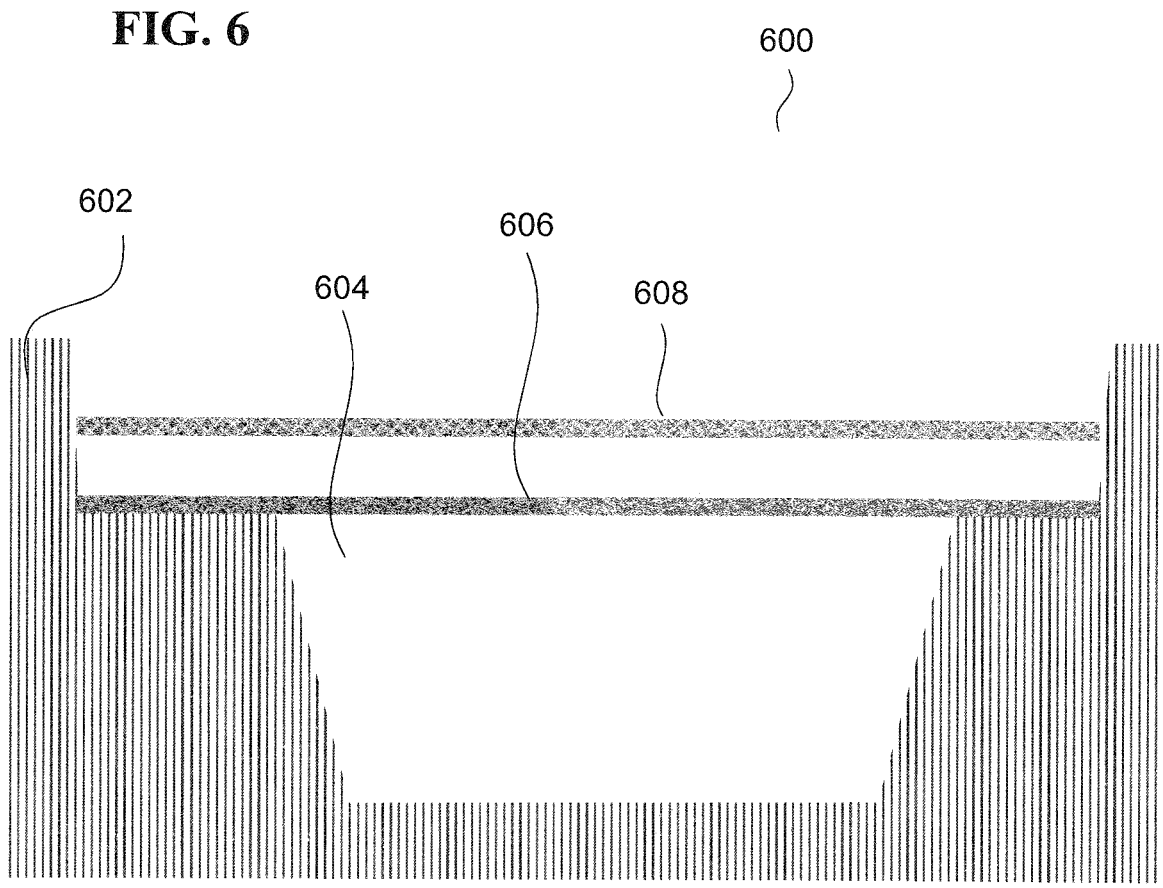
FIG. 6 shows a cross sectional view of a MEMS pressure sensor or pressure sensing system in accordance with various embodiments.

According to various embodiments, the holding structure 202 may be implemented in a MEMS pressure sensor or pressure sensing system. For example, as illustrated in FIG. 6, a MEMS pressure sensor configuration 600 which may use a substrate structure 602 with a pressure cavity 604 formed therein; a diaphragm element 606 suspended across the pressure cavity 604; and a reference element 608 likewise suspended across the pressure cavity 604 and arranged such that it is parallel to the diaphragm element 606; to create a variable capacitor which may detect deflection of the diaphragm element 606 due to an applied pressure over an area of the diaphragm element 606. The diaphragm element 606 in this type of MEMS pressure sensor may be subject to similar types of stress (discussed above) as experienced by the membrane 100, particularly in the areas where the diaphragm may be secured or fixed to the substrate structure.

In various embodiments, the structure may be configured as a speaker, e.g. a MEMS speaker system, which may be actively driven. This will be explained in more detail below.

Figure 7:
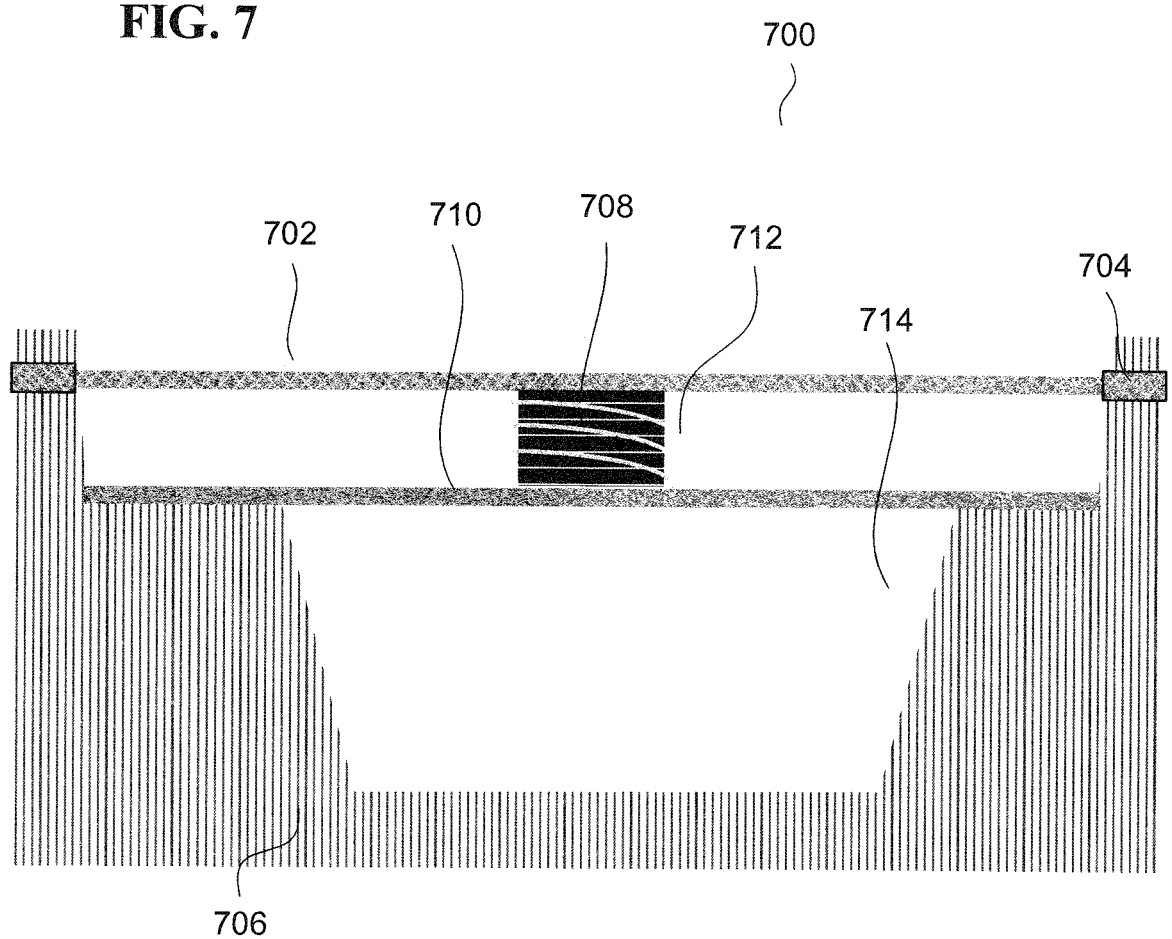
FIG. 7 shows a cross sectional view of a MEMS speaker or speaker system in accordance with various embodiments.

According to various embodiments, the holding structure 202 may be implemented in a MEMS speaker or speaker system. For example, as illustrated in FIG. 7, a MEMS speaker assembly 700 may include a movable oscillator element 702 (in other words a membrane) suspended from a support structure 704 formed in a substrate structure 706. The MEMS speaker assembly may further include a magnetic material 708 attached to said oscillator element 702 and supported by a support layer 710 and an electrically conductive coil 712 which may surround the magnetic material 708. If an electric current flows through said conductive coil 712, the magnetic material 708 may be displaced. The magnitude and/or direction of said electric current in the conductive coil 712 determines the extent to which the magnetic material 708 may be displaced. The displacement of the magnetic material 708 may cause the oscillator element 702 to move and the movement may produce sound waves that are of sufficient magnitude and appropriate frequencies to be detected by the human ear. In the MEMS speaker, the oscillator element 702 may be subjected to stress due to oscillation whenever the device is operating. This may subject the oscillator element 702 to similar types of stress (discussed above) as experienced by the membrane 100, particularly in the areas where the oscillator element may be secured or fixed to the support layer in the substrate structure. In another example (not shown), the MEMS speaker assembly 700 may be implemented as a piezoelectric micro-speaker. A typical piezoelectric micro-speaker may contain a membrane structure suspended over pressure cavity. The membrane structure may contain a piezoelectric actuator material, such as e.g. MN or PZT. When a voltage is applied across the piezoelectric actuator, it deforms and or vibrates and produces sound waves. This vibration may subject the membrane structure to similar types of stress (discussed above) as experienced by the membrane 100, particularly in the areas where the the membrane structure may be secured or fixed at the edge of the pressure cavity.

According to various embodiments, the holding structure 202 may be implemented in various MEMS switches or switching system.

According to various embodiments, a structure is disclosed. The structure may include a carrier 104, a suspended structure 100, and a holding structure 202 configured to fix or attach the suspended structure 100 to the carrier 104 where the holding structure 202 may have a concave shape and a tapered side 202*c* of the holding structure 202 may physically connect to the suspended structure 100.

According to various embodiments, a surface of the holding structure 202 is fixed to a surface of the carrier 104. In at least one embodiment, the bottom surface 202*a* of the holding structure 202 may be fixed to a top surface 104*a* of the carrier 104.

According to various embodiments, a surface of the suspended structure 100 is fixed to a surface of the holding structure 202. In various embodiments, a backside 100*a* of the suspended structure 100 may be fixed to the top surface 202*b* of the holding structure 202.

In various embodiments, the carrier 104 may be a semiconductor substrate.

In various embodiments, the carrier 104 may be a silicon-on-insulator (SOI) substrate.

In various embodiments, the carrier 104 may be a glass substrate.

In various embodiments, the holding structure 202 further includes a first material and a second material. In various embodiments, the concentration of the second material in the first material may be continuously varied as a function of location within the first material relative to the carrier 104.

In various embodiments, at least one of the first material and the second material may be a semiconductor material.

In various embodiments, at least one of the first material and the second material may be a dielectric material.

According to various embodiments, at least one of the first material and the second material may be metal.

According to various embodiments, the suspended structure 100 may be a membrane material.

According to various embodiments, the membrane material may be a semiconductor membrane material.

According to various embodiments, the membrane material may be a ferroelectric membrane material.

According to various embodiments, the membrane material may be a piezoelectric membrane material.

According to various embodiments, a method of forming a holding structure 202 on a carrier 104 to support a suspended structure 100 is disclosed. The method may include forming a suspended structure 100 over a carrier 104; forming a holding structure 202 to fix the suspended structure 100 to the carrier 104; where the holding structure 202 has a concave shape and a tapered side of the holding structure 202 and may physically connect to the suspended structure 100.

According to various embodiments, the method may include a holding structure 202 that is shaped after the suspended structure 100 is formed on the holding structure 202.

According to various embodiments, the method may include a holding structure 202 that is shaped by an etching process such that the etching process does not etch the suspended structure 100.

According to various embodiments, the method may include that the shape of the holding structure 202 is determined by a first material and a second material, wherein the second material is introduced into, e.g. diffused into the first material and the concentration of the second material in the first material is continuously varied as a function of location within the first material relative to the carrier 104. In various embodiments, the holding structure 202 may be compositionally graded. In various embodiments, the holding structure 202 may enable a curved etching, in other words different areas having different etching rates with respect to the same etchant. In various embodiments, the holding structure 202 may include a composite of two or more materials to provide the holding structure 202 compositionally graded. The holding structure 202 may e.g. include of essentially consist of silicon oxide ($SiO_x$) and/or silicon nitride ($Si_xN_y$) and/or silicon oxynitride ($SiO_xN_y$, with varying x and y).

In various embodiments, a structure is provided. The structure may include a carrier, a suspended structure, and a holding structure configured to fix the suspended structure to the carrier. The holding structure may be compositionally graded.

While the disclosure has been particularly shown and described with reference to specific embodiments, it should be understood by those skilled in the art that various changes in form and detail may be made therein without departing from the spirit and scope of the invention as defined by the appended claims. The scope of the disclosure is thus indicated by the appended claims and all changes which come within the meaning and range of equivalency of the claims are therefore intended to be embraced.

What is claimed is:

1. A method of forming a structure comprising:
    forming a suspended structure over a carrier, the carrier comprising a cavity;
    forming a holding structure to fix the suspended structure to the carrier, wherein the holding structure comprises a concavely curved sidewall that extends from a top surface of the carrier to a tapered end of the holding structure;
    wherein the top surface of the carrier faces toward the suspended structure,
    wherein the sidewall of the holding structure is laterally disposed at least partially outside the cavity,
    wherein a bottom surface of the holding structure is attached to the top surface of the carrier,
    wherein a bottom surface of the suspended structure is fixed to a top surface of the holding structure, and
    wherein at least a portion of the bottom surface of the holding structure is exposed through the cavity of the carrier.

2. The method of claim 1, wherein the holding structure is compositionally graded.

3. The method of claim 2, wherein the holding structure comprises a first material and a second material, different from the first material wherein a concentration of the second material in the first material is continuously varied as a function of location within the first material relative to the carrier.

4. The method of claim 3 wherein the second material is diffused into the first material.

5. The structure of claim 3, wherein the concentration of the second material at the top surface of the carrier is lower than the concentration of the second material at the bottom surface of the suspended structure.

6. The method of claim 3, wherein the first material is silicon oxide and the second material is nitrogen.

7. The method of claim 1,
wherein forming the holding structure comprises performing an etching process.

8. The method of claim 7,
wherein performing the etching process comprises etching with at least two different etch rates so as to form the holding structure with the concavely curved sidewall.

9. The method of claim 8,
wherein etching comprises etching with a first etching rate at a point of the holding structured fixed to the back side of the suspended structure, the back side of the suspended structure facing the holding structure, and etching with a second etching rate at a point of the holding structure fixed at a front side of the carrier, the front side of the carrier facing the suspended structure,
wherein the first etching rate is lower than the second etching rate.

10. The method of claim 8, wherein the etching process comprises etching a silicon oxinitride compound material with a fluoridic acid, wherein the silicon oxintride includes a varying or graded nitrogen content X so that the chemical composition of the silicon oxinitride is defined by $SiO_{1-x}N_x$.

11. The method of claim 10, further comprising:
forming the silicon oxinitride compound material with physical vapor deposition, electrochemical deposition, chemical vapor deposition, molecular beam epitaxy, and/or atomic layer deposition.

12. The method of claim 1, wherein the carrier comprises a semiconductor substrate.

13. The method of claim 1, wherein the carrier comprises a silicon-on-insulator substrate or a glass substrate.

14. The method of claim 1, wherein the suspended structure comprises a membrane material.

15. The method of claim 1, wherein the concavely curved sidewall of the holding structure has a circular or substantially circular shape, an elliptical or substantially elliptical shape, a parabolic or substantially parabolic shape, or a hyperbolic or substantially hyperbolic shape.

16. The method of claim 1, wherein the tapered end is attached to the bottom surface of the suspended structure.

17. The method of claim 1,
forming a further graded holding structure on a frontside of the suspended structure,
attaching a further suspended structure to a frontside of the further graded holding structure
to the carrier,
wherein the further holding structure comprises a concavely curved sidewall that extends from a first tapered end of the holding structure at a top surface of the suspended structure to a second tapered end of the holding structure attached to the further suspended structure.

18. A method of forming a structure comprising:
forming a suspended structure over a carrier, the carrier comprising a cavity;
forming a holding structure to fix the suspended structure to the carrier, wherein the holding structure comprises a concavely curved sidewall that extends from a top surface of the carrier to a tapered end of the holding structure;
wherein the top surface of the carrier faces toward the suspended structure,
wherein the sidewall of the holding structure is laterally disposed at least partially outside the cavity,
wherein the holding structure is compositionally graded, and
wherein the holding structure comprises a first material and a second material, different from the first material wherein a concentration of the second material in the first material is continuously varied as a function of location within the first material relative to the carrier.

19. A method of forming a structure comprising:
forming a suspended structure over a carrier, the carrier comprising a cavity;
forming a holding structure to fix the suspended structure to the carrier, wherein the holding structure comprises a concavely curved sidewall that extends from a top surface of the carrier to a tapered end of the holding structure;
wherein the top surface of the carrier faces toward the suspended structure,
wherein the sidewall of the holding structure is laterally disposed at least partially outside the cavity,
wherein forming the holding structure comprises performing an etching process, and wherein performing the etching process comprises etching with at least two different etch rates so as to form the holding structure with the concavely curved sidewall,
wherein the etching process comprises etching a silicon oxinitride compound material with a fluoridic acid, wherein the silicon oxintride includes a varying or graded nitrogen content X so that the chemical composition of the silicon oxinitride is defined by $SiO_{1-x}N_x$.

* * * * *

UNITED STATES PATENT AND TRADEMARK OFFICE
CERTIFICATE OF CORRECTION

PATENT NO. : 11,679,461 B2
APPLICATION NO. : 17/681848
DATED : June 20, 2023
INVENTOR(S) : Alfons Dehe et al.

It is certified that error appears in the above-identified patent and that said Letters Patent is hereby corrected as shown below:

On the Title Page

Item "(62) Related U.S. Application Data" please add:
-- Division of application No. 14/198,646, filed on March 6, 2014, now Pt. No. 10,322,481 --

Signed and Sealed this
Twenty-ninth Day of August, 2023

Katherine Kelly Vidal
*Director of the United States Patent and Trademark Office*